United States Patent
Yonenaka et al.

(10) Patent No.: US 7,177,162 B2
(45) Date of Patent: Feb. 13, 2007

(54) ENCLOSURE FOR A NETWORK COMMUNICATIONS MODULE

(75) Inventors: Tom Yonenaka, Daly City, CA (US); Phil Cole, Redwood City, CA (US)

(73) Assignee: Network Equipment Technologies, Inc., Fremont, CA (US)

(*) Notice: Subject to any disclaimer, the term of this patent is extended or adjusted under 35 U.S.C. 154(b) by 0 days.

(21) Appl. No.: 11/269,937

(22) Filed: Nov. 8, 2005

(65) Prior Publication Data

US 2006/0056163 A1    Mar. 16, 2006

Related U.S. Application Data

(63) Continuation of application No. 10/286,359, filed on Oct. 31, 2002, now abandoned.

(51) Int. Cl.
*H02B 1/00* (2006.01)
*H05K 7/14* (2006.01)

(52) U.S. Cl. .................. 361/826; 361/788; 361/796; 211/41.17

(58) Field of Classification Search ............... 361/796, 361/679, 788, 752, 822, 826, 823, 837; 211/41.17
See application file for complete search history.

(56) References Cited

U.S. PATENT DOCUMENTS

| 4,442,476 | A | * | 4/1984 | Lenderking et al. | 361/736 |
| 4,542,443 | A | * | 9/1985 | Rinefierd, Jr. | 361/800 |
| 5,957,556 | A | * | 9/1999 | Singer et al. | 312/223.6 |
| 6,625,019 | B1 | * | 9/2003 | Steinman et al. | 361/695 |
| 6,661,671 | B1 | * | 12/2003 | Franke et al. | 361/752 |
| 6,922,342 | B2 | * | 7/2005 | Doblar et al. | 361/736 |

* cited by examiner

*Primary Examiner*—Tuan Dinh
*Assistant Examiner*—Dameon E. Levi
(74) *Attorney, Agent, or Firm*—Townsend and Townsend and Crew LLP

(57) ABSTRACT

An electronic device that includes a housing that defines an envelope and that defines a horizontal routing channel within the envelope. A plurality of boards is arranged horizontally within the housing and at least one board includes input-output ports. At least one communication conduit is coupled to an input-output port. The boards that include input-output ports are recessed with respect to the envelope and are arranged such that the input-output ports are adjacent to the routing channel. Communication conduits are routed through the routing channel.

17 Claims, 2 Drawing Sheets

ENCLOSURE FOR A NETWORK COMMUNICATIONS MODULE

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

1. Field of the Invention

The present invention relates to a vertical enclosure for an electronic device, and more particularly, to a horizontally oriented enclosure for a network communications module that facilitates input-output cable management.

2. Description of the Prior Art

The amount of data communicated through networks, such as the Internet, is increasing dramatically. To meet the increased demand for network bandwidth, data networks that transfer data at faster and faster rates have been developed. As the new networks are developed, more and more equipment is required for handling the data transfer. Thus, telecommunications systems are becoming larger, more complex and greater in number.

Such telecommunication systems generally include numerous telecommunication network modules within the system. These modules usually include various components in the form of circuit boards or modules, many of which are plug-in modules. Many of these modules provide input-output for the network communication module. These input-outputs couple the network communication modules to the overall network within the telecommunication system. Generally, communication conduits in the form of cables are used to couple the input-output ports on the network communication module to other network communication modules or components or to the telecommunication system or network.

Generally, it is difficult to organize and manage the cables. This is especially true since the network communication modules have become increasingly more complex and therefore, require more cables. Furthermore, in order to provide easy access in interchangeability of plug-in modules, the cables are coupled to the front of the network communication module and thus, the cables are exposed to passersby. This leads to the problem of keeping the cables out of the way of passersby and avoiding having the cables inadvertently bumped and thereby decoupled from the network communication module.

SUMMARY OF THE INVENTION

The present invention provides an electronic device that includes a housing that defines an envelope and that defines a horizontal routing channel within the envelope. A plurality of boards is arranged horizontally within the housing and at least one board includes input-output ports. At least one communication conduit is coupled to an input-output port. The boards that include input-output ports are recessed with respect to the envelope and are arranged such that the input-output ports are adjacent to the routing channel. Communication conduits are routed through the routing channel.

In accordance with one aspect of the present invention, the electronic device is a network communications module and the plurality of boards include one network data processor, two input-output modules, including input-output ports, one multi-function card (MFC), and one power entry module.

In accordance with another aspect of the present invention, the electronic device includes a fan tray within the housing.

In accordance with a further aspect of the present invention, the power entry module and MFC are also adjacent to the routing channel.

In accordance with a further aspect of the present invention, the electronic device includes a cover that at least partially covers the routing channel.

In accordance with another aspect of the present invention, the envelope is in a range of 16.8–17.8 inches long, 4.5–5.5 inches deep and 10.5–11.5 inches high.

In accordance with another aspect of the present invention, the boards that are recessed are recessed in a range of 1.0–2.5 inches.

In accordance with another aspect of the present invention, the envelope is substantially 17.3 inches long, 5.0 inches deep and 11.0 inches high.

Thus, the present invention provides an enclosure for an electronic device that facilitates placement and routing of cables coupled to the input-output ports. Additionally, an enclosure is provided that is compact and efficiently organized.

The preferred exemplary embodiments of this invention will now be discussed in detail. These embodiments depict the novel and nonobvious electronic device arrangements and methods of this invention shown in the accompanying drawings, which are included for illustrative purposes only, with like numerals indicating like elements.

DETAILED DESCRIPTION OF THE INVENTION

Figure 1:
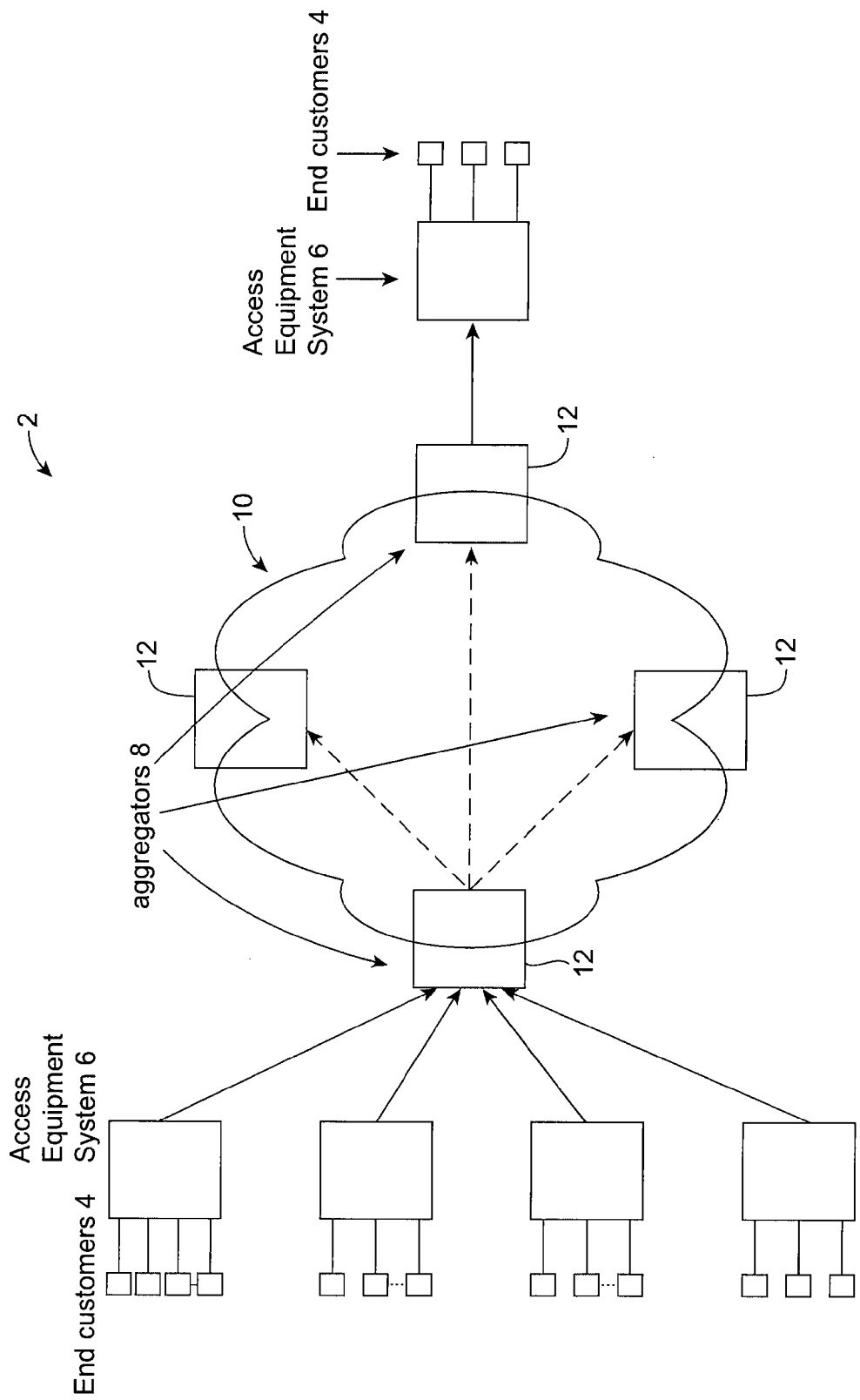
FIG. 1 depicts a simplified block diagram of a telecommunications system.

FIG. 1 depicts a simplified block diagram of a telecommunications system 2 according to one embodiment of the present invention. Telecommunications system 2 includes end customer devices 4, access equipment 6, aggregators 8, and a network 10.

End customer devices 4 are computing devices, such as personal computers (PCs), workstations, personal digital assistants (PDAs), cellular phones, personal PCs, and the like, that communicate data. The data are transmitted to access equipment system 6 through communication lines.

Access equipment systems 6 aggregate and multiplex the data received from end customer devices 4. Examples of access equipment systems 6 include digital subscriber line access multiplexer (DSLAM), multiplexers, etc. Data received at access equipment systems 6 are then sent to aggregators 8. Data from a single access equipment system 6 are typically sent in a specific data format and a specific data rate. For example, the data formats include SONET/SDH (OC3, OC12, OC48, etc.), DS3/E3, Ethernet, Gigabit Ethernet, etc. Data in these formats are also transferred at various data rates, where a fixed data rate is associated with a format.

Aggregator 8 receives the data from access equipment systems 6 in the different formats. Aggregator 8 processes the data in the different formats and may send the data to one or more other aggregators 8. Data may be sent in different formats than the received data format. Data are then sent to access equipment system 6 and to another end customer 4 through network 10. Network 10 may be any network, such as the Internet.

A plurality of network communication modules 12 are provided within network 10 to receive data from a variety of ports. Network communications modules 12 generally are in the form of computer-type devices that include a housing with a plurality of electronic circuit boards or cards. Many of these are in the form of plug-in modules that are slid into guides within the housing. The plug-in modules are often latched into place to secure them within the guides.

Figure 2:
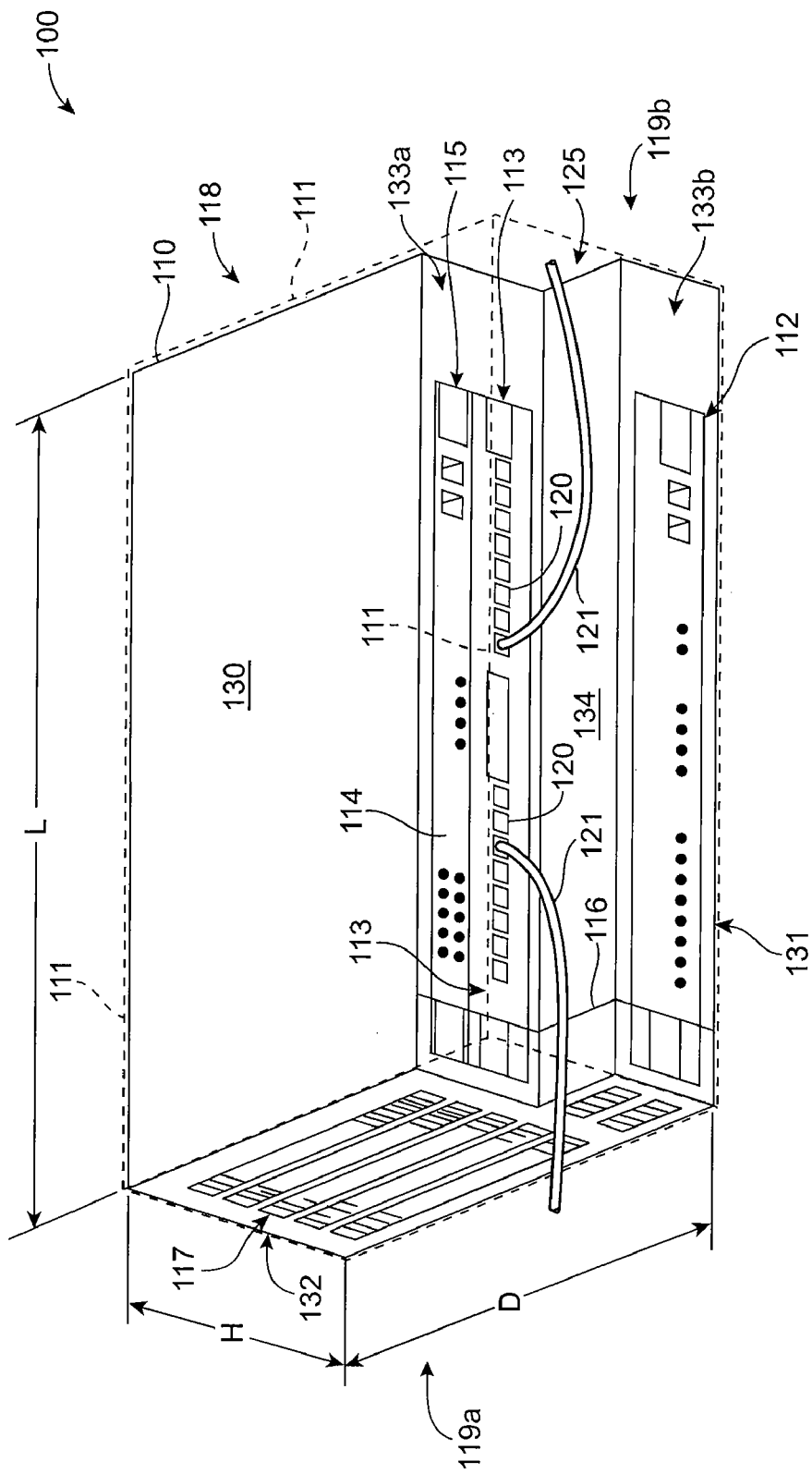
FIG. 2 is a perspective view of an electronic device, such as a network communication module, in accordance with the present invention.

FIG. 2 illustrates an electric device 100 in accordance with the present invention. The device includes a housing 110 that defines an envelope 111. The envelope is defined by dimensions H, L, and D. The device includes a plurality of electronic circuit boards or cards. Many of these are in the form of plug-in modules that are usually removable and interchangeable.

In a preferred embodiment, the electronic device is a network communications module 12 and thus, includes a network data processor 112, plug-in modules 113, a power entry modules 114, and a multifunction card 115. A fan tray 116 including a fan (not shown) is also preferably included. As can be seen, the fan tray is preferably located near one side 119a of the network communications module and includes an inlet 117. An exhaust 118 is located on opposite side 119b of the device. Thus, the fan intakes air from side 119a of the device and moves it across the boards of the device. The air exits out of the exhaust on side 119b.

Some of the boards include input/output terminals 120. Thus, communication conduits 121, preferably in the form of cables or wires, are coupled to the input/output ports. The communication conduits are then routed to other devices or to network 10 so that the network communication modules may communicate with the telecommunication system.

As can be seen in FIG. 2, a routing channel 125 is defined by the housing. Thus, boards with input/output ports are recessed within the envelope defined by the electronic device. Other boards may also be adjacent the routing channel, and therefore recessed. In the example illustrated in FIG. 2, plug-in modules 113 that include input/output ports and power module 114 are recessed in addition to the multifunction card 115, which may include input/output ports.

The routing channel is substantially horizontal. This allows for routing of communication conduits 121 to either side of the electronic device, or even over the top of the electronic device.

Thus, communication conduits 121 coupled to input/output ports 120 on the electronic device are routed through a portion of the routing channel. Thus, the communication conduits are not exposed outside the envelope of the electronic device. This helps prevent the communication conduits from being accidentally bumped or torn from the input/output ports. Additionally, the routing channel helps in the organization and arrangement of the communication conduits.

Housing 110 generally includes a top wall 130, a bottom wall 131, rear wall 132, two front walls 133a, 133b and an intermediate wall 134. These walls, including side walls 119a, 119b, are preferably stamped or cut from sheet metal.

An example of dimensions for the envelope are in a range of 10½"–11½" deep, with 11 inches being a preferred depth; 16.8"–17.8" long, with 17.3 inches being a preferred length; and 4.5"–5.5" high, with 5 inches being a preferred height.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. An electronic device comprising:
    a housing that defines an envelope and that defines a horizontal routing channel within the envelope; a plurality of boards arranged horizontally within the housing, at least one board including input/output ports; and at least one communication conduit coupled to an input/output port;
    wherein boards that include input/output ports are recessed with respect to the envelope and are arranged such that the input/output ports are adjacent the routing channel; and wherein communication conduits coupled to input/output ports of multiple boards are routed through the routing channel; and wherein the envelope is in a range of 16.8–17.8 inches long, 4.5–5.5 inches deep and 10.5–11.5 inches high.

2. An electronic device in accordance with claim 1 wherein the electronic device is a network communications module and the plurality of boards comprises one network data processor, two input/output modules including input/output ports, one MFC and one power entry module.

3. An electronic device in accordance with claim 2 further comprising a fan tray within the housing.

4. An electronic device in accordance with claim 2 wherein the power entry module and MFC are also adjacent the routing channel.

5. An electronic device in accordance with claim 1 further comprising a cover that at least partially covers the routing channel.

6. An electronic device in accordance with claim 1 wherein the boards that are recessed are recessed in a range of 1.0–2.5 inches.

7. An electronic device in accordance with claim 1 wherein the envelope is substantially 17.3 inches long, 5.0 inches deep and 11.0 inches high.

8. An electronic device in accordance with claim 7 wherein the boards that are recessed are recessed in a range of 1.0–2.5 inches.

9. A telecommunications system comprising at least one network communications module, the network communications module comprising:
    a housing that defines an envelope and that defines a horizontal routing channel within the envelope; a plurality of boards arranged horizontally within the housing, at least one board including input/output ports; and at least one communication conduit coupled to an input/output port; wherein boards that include input/output ports are recessed with respect to the envelope and are arranged such that the input/output ports are adjacent the routing channel; and wherein communication conduits coupled to input/output ports of multiple boards are routed through the routing and
wherein the envelope is in a range of 16.8–17.8 inches long, 4.5–5.5 inches deer and 10.5–11.5 inches high.

10. A telecommunications system in accordance with claim 9 wherein the plurality of boards comprises one network data processor, two input/output modules including input/output ports, one MFC and one power entry module.

11. A telecommunications system in accordance with claim 10 further comprising a fan tray within the housing.

12. A telecommunications system in accordance with claim 10 wherein the power entry module and MFC are also adjacent the routing channel.

13. A telecommunications system in accordance with claim 9 wherein the network communications module further comprises a cover that at least partially covers the routing channel.

14. An electronic device in accordance with claim 9 wherein the boards that are recessed are recessed in a range of 1.0–2.5 inches.

15. An electronic device in accordance with claim 9 wherein the envelope is substantially 17.3 inches long, 5.0 inches deep and 11.0 inches high.

16. An electronic device in accordance with claim 15 wherein the boards that are recessed are recessed in a range of 1.0–2.5 inches.

17. A method of managing communication conduits within a network telecommunications system, the method comprising:
 providing a network communications module that defines an envelope and a horizontal routing channel within the envelope ,wherein the envelope is in a range of 16.8–17.8 inches long, 4.5–5.5 inches deep and 10.5–11.5 inches high;
 coupling communication conduits to input/output ports of multiple boards within the network communications module, the input/out ports being recessed within the envelope; and routing the communication conduit from the input/output ports of the multiple boards through the routing channel.

* * * * *